(12) United States Patent
Hou et al.

(10) Patent No.: US 11,245,049 B2
(45) Date of Patent: Feb. 8, 2022

(54) METHOD OF MANUFACTURING OPTOELETRONIC DEVICE EPITAXIAL STRUCTURE

(71) Applicant: BOE Technology Group Co., Ltd., Beijing (CN)

(72) Inventors: Mengjun Hou, Beijing (CN); Zongmin Liu, Beijing (CN)

(73) Assignee: BOE TECHNOLOGY GROUP CO., LTD.

( * ) Notice: Subject to any disclaimer, the term of this patent is extended or adjusted under 35 U.S.C. 154(b) by 61 days.

(21) Appl. No.: 16/713,197

(22) Filed: Dec. 13, 2019

(65) Prior Publication Data
US 2020/0313033 A1    Oct. 1, 2020

(30) Foreign Application Priority Data
Mar. 25, 2019 (CN) .......................... 201910226595.5

(51) Int. Cl.
*H01L 33/00* (2010.01)
*H01L 31/18* (2006.01)
*H01L 25/16* (2006.01)

(52) U.S. Cl.
CPC .......... *H01L 33/007* (2013.01); *H01L 25/167* (2013.01); *H01L 31/1852* (2013.01); *H01L 31/1856* (2013.01); *H01L 33/0075* (2013.01); *H01L 33/0093* (2020.05)

(58) Field of Classification Search
CPC ............... H01L 33/007; H01L 33/0093; H01L 33/0075; H01L 31/1852; H01L 25/167; H01L 31/1856; H01L 33/005
See application file for complete search history.

(56) References Cited

U.S. PATENT DOCUMENTS

| | | | | |
|---|---|---|---|---|
| 6,030,849 A | * | 2/2000 | Hasegawa | H01L 21/0242 117/106 |
| 10,727,053 B2 | * | 7/2020 | Ni | H01L 29/0684 |
| 2001/0053618 A1 | * | 12/2001 | Kozaki | H01L 21/02433 257/628 |
| 2002/0111104 A1 | * | 8/2002 | Kim | H01J 9/241 445/66 |

(Continued)

FOREIGN PATENT DOCUMENTS

| CN | 102130230 A | * | 7/2011 |
|---|---|---|---|
| CN | 102130230 A | | 7/2011 |
| CN | 105870265 A | | 8/2016 |

OTHER PUBLICATIONS

First office action of Chinese application No. 201910226595.5 dated Aug. 20, 2020.

(Continued)

*Primary Examiner* — Earl N Taylor
(74) *Attorney, Agent, or Firm* — Fay Sharpe LLP

(57) ABSTRACT

Embodiments of the present disclosure provide a method of manufacturing an optoelectronic device epitaxial structure. The method includes forming a mask pattern on a base substrate, the mask pattern defining a plurality of growth regions on the base substrate, and the plurality of growth regions being separated from each other; and forming an optoelectronic device epitaxial structure in each of the plurality of growth regions; and removing the mask pattern.

20 Claims, 4 Drawing Sheets

(56) References Cited

U.S. PATENT DOCUMENTS

| | | | | |
|---|---|---|---|---|
| 2002/0185611 A1* | 12/2002 | Menapace | ............... | C03C 19/00 250/492.1 |
| 2005/0179045 A1* | 8/2005 | Ryu | ....................... | H01L 33/04 257/94 |
| 2005/0272599 A1* | 12/2005 | Kramer | ................... | B29C 33/60 502/227 |
| 2008/0280099 A1* | 11/2008 | Hutchison | ............... | H01J 37/20 428/138 |
| 2011/0031529 A1* | 2/2011 | Miura | .............. | H01L 21/02381 257/184 |
| 2012/0097975 A1* | 4/2012 | Lee | .................... | H01L 21/0254 257/77 |
| 2012/0171791 A1* | 7/2012 | Tu | .......................... | H01L 33/20 438/33 |
| 2013/0230974 A1* | 9/2013 | Martinez | ........... | H01L 21/68771 438/464 |
| 2018/0219123 A1* | 8/2018 | Wang | ...................... | H01L 33/00 |
| 2019/0237323 A1* | 8/2019 | Nishimura | ........ | H01L 21/02433 |
| 2019/0333766 A1* | 10/2019 | Ni | ..................... | H01L 29/66462 |
| 2020/0203580 A1* | 6/2020 | Marutani | ............. | H01L 27/153 |
| 2020/0313033 A1* | 10/2020 | Hou | ..................... | H01L 33/005 |

OTHER PUBLICATIONS

Second office action of Chinese application No. 201910226595.5 dated Sep. 29, 2020.

* cited by examiner

METHOD OF MANUFACTURING OPTOELETRONIC DEVICE EPITAXIAL STRUCTURE

This application claims priority to Chinese Patent Application No. 201910226595.5, filed on Mar. 25, 2019 and entitled "METHOD OF MANUFACTURING OPTOELECTRONIC DEVICE EPITAXIAL STRUCTURE", the entire contents of which is incorporated herein by reference.

TECHNICAL FIELD

Embodiments of the present disclosure disclose a method of manufacturing an optoelectronic device epitaxial structure.

BACKGROUND

An optoelectronic device epitaxial structure is an electronic component capable of performing photoelectric conversion or electro-optical conversion. It has the characteristics of small size, high brightness, low energy consumption and etc. The optoelectronic device epitaxial structure may comprise a light emitting diode (LED) epitaxial structure, a photodetector epitaxial structure, a laser epitaxial structure, or the like.

SUMMARY

Embodiments of the present disclosure provide a method of manufacturing an optoelectronic device epitaxial structure, which can solve the problem that the method of manufacturing optoelectronic device epitaxial structure in the related art affects the performance of the optoelectronic device epitaxial structure.

At least one embodiment of the present disclosure provides a method of manufacturing an optoelectronic device epitaxial structure, the method comprising:

forming a mask pattern on a base substrate, the mask pattern defining a plurality of growth regions on the base substrate, the plurality of growth regions being separated from each other;

forming a optoelectronic device epitaxial structure in each of the plurality of growth regions; and removing the mask pattern.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure will be described in further detail with reference to the accompanying drawings, to present the objects, technical solutions, and advantages of the present disclosure more clearly.

In the related arts, a process of manufacturing an optoelectronic device epitaxial structure may comprise: first, forming a semiconductor film layer on a base substrate; and thereafter, exposing, developing, and etching the base substrate on which the semiconductor film layer is formed, so as to obtain an optoelectronic device epitaxial structure.

However, during the process of manufacturing the optoelectronic device epitaxial structure, the semiconductor film layer which is formed in an entire layer is required to be etched so as to obtain an optoelectronic device epitaxial structure. This method is prone to cause damage to a sidewall of the formed optoelectronic device epitaxial structure, which affects the performance of the optoelectronic device epitaxial structure.

Figure 1:
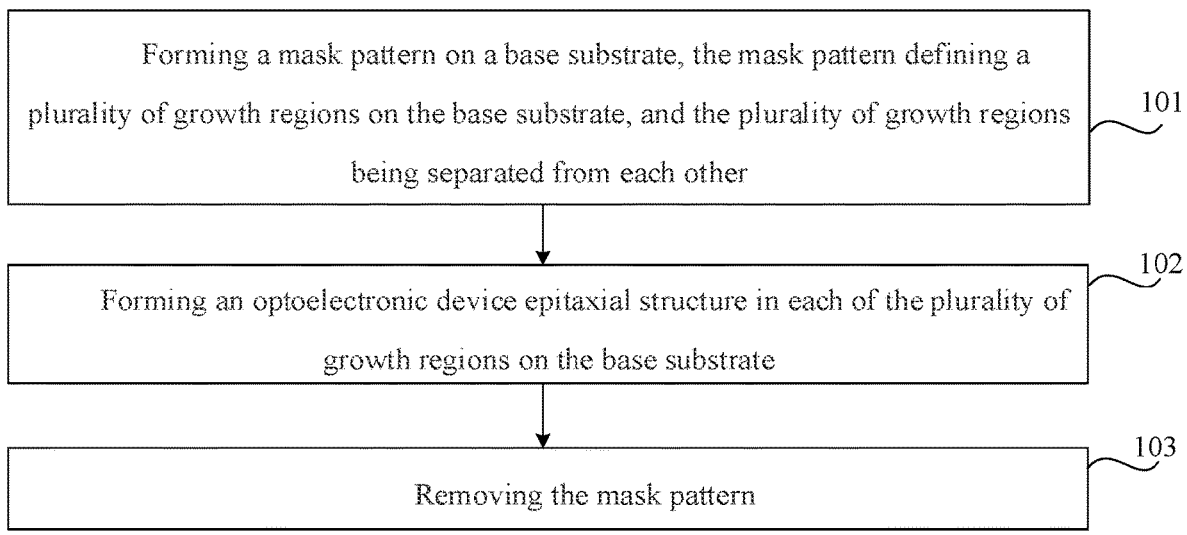
FIG. 1 is a flowchart of a method of manufacturing an optoelectronic device epitaxial structure according to an embodiment of the present disclosure.
Figure 2:
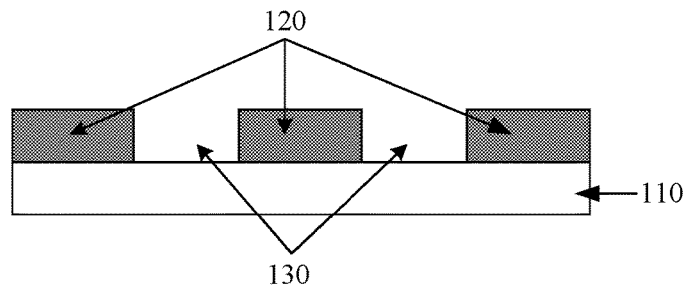
FIG. 2 is a schematic structural diagram of a base substrate on which a mask pattern and a growth region are formed according to an embodiment of the present disclosure.
Figure 3:
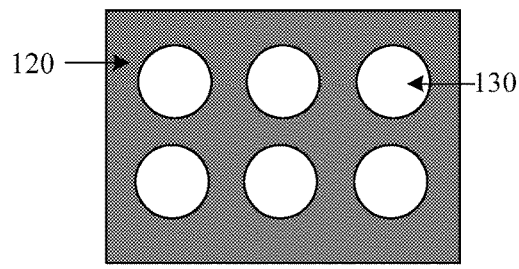
FIG. 3 is a plan view of a mask pattern defining a plurality of growth regions on a base substrate, which are separated from each other according to an embodiment of the present disclosure.

At least one embodiment of the present disclosure provides a method of manufacturing an optoelectronic device epitaxial structure, as illustrated in FIG. 1, the method comprising:

Step 101, forming a mask pattern on a base substrate, the mask pattern defining a plurality of growth regions on the base substrate, and the plurality of growth regions being separated from each other;

In the embodiment of the present disclosure, the mask pattern 120 can be formed on the base substrate 110 through a single patterning process. Referring to FIG. 2 and FIG. 3, the mask pattern can define a plurality of growth regions 130 on the base substrate 110, the plurality of growth regions 130 are separated from each other and arranged in array on the base substrate 110. The single patterning process can include steps of depositing a film layer, applying a photoresist, exposing, developing, etching, and peeling off the photoresist, and etc.

Figure 4:
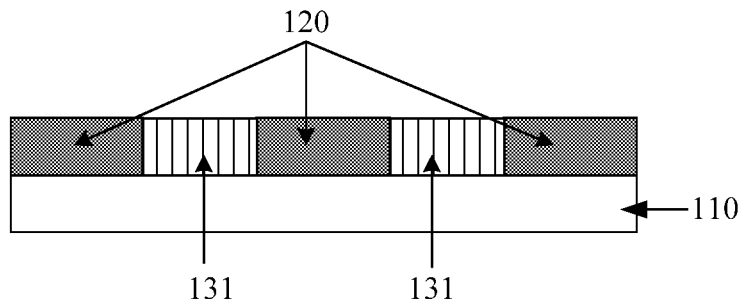
FIG. 4 is a schematic structural diagram of a base substrate on which an optoelectronic device epitaxial structure is formed in each of the plurality of growth region according to an embodiment of the present disclosure.

Step 102, forming an optoelectronic device epitaxial structure in each of the plurality of growth regions on the base substrate; and As illustrated in FIG. 4, an optoelectronic device epitaxial structure can be formed in each of the plurality of growth regions on the base substrate. Exemplarily, the optoelectronic device epitaxial structure may be a light emitting diode (LED) epitaxial structure, a photodetector epitaxial structure, a laser epitaxial structure, or the like. Of course, the optoelectronic device epitaxial structure may further be an epitaxial structure of other kind.

Step 103, removing the mask pattern.

Figure 5:
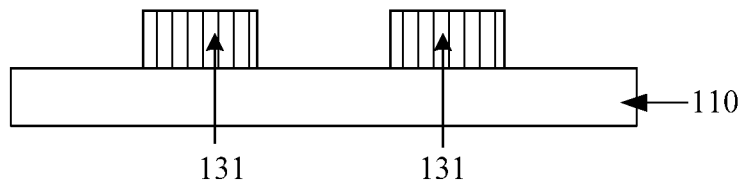
FIG. 5 is a schematic structural diagram of a base substrate from which the mask pattern is removed according to an embodiment of the present disclosure.

Referring FIG. 5, a plurality of optoelectronic device epitaxial structures can be formed on the base substrate from which the mask pattern 120 is removed, wherein the plurality of optoelectronic device epitaxial structures are separated from each other.

In some embodiments of the present disclosure, a plurality of growth regions 130 may be arranged in array on the base substrate 110. After removing the mask pattern 120, a plurality of optoelectronic device epitaxial structures 131 arrayed in array on the base substrate 110 can be obtained.

In summary, in the method of manufacturing an optoelectronic device epitaxial structure according to the embodiments of the present disclosure, a plurality of spaced-apart growth regions are defined on a base substrate by a mask pattern, so that an optoelectronic device epitaxial structure can be directly obtained through forming the optoelectronic device epitaxial structure in each of the growth regions on the base substrate and removing the mask pattern, and it is not required to etch the semiconductor film layer formed in an entire layer on the base substrate. With respect to the related arts, in this method, it is avoided to cause damage to a sidewall of the formed optoelectronic device epitaxial structure, the performance of the optoelectronic device epitaxial structure can be guaranteed.

Figure 6:
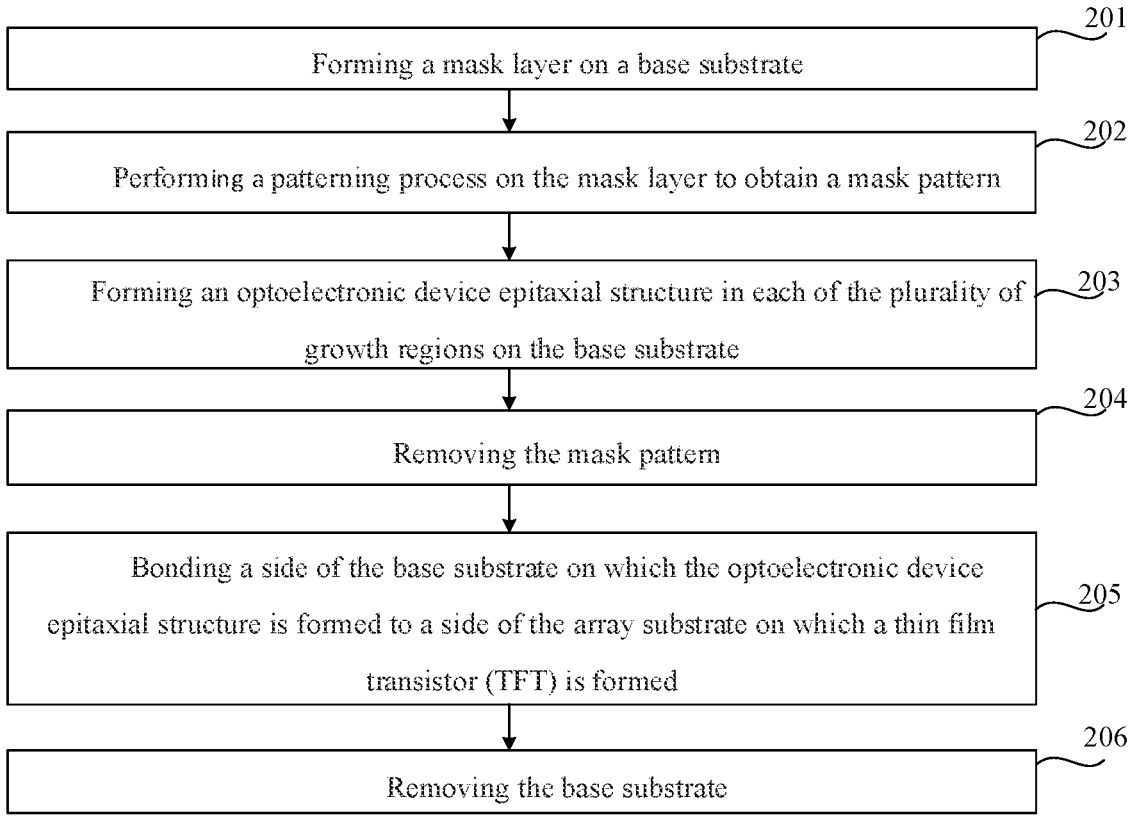
FIG. 6 is a flowchart of a method of manufacturing an optoelectronic device epitaxial structure according to another embodiment of the present disclosure.

At least one embodiment of the present disclosure provides a method of manufacturing an optoelectronic device epitaxial structure, as illustrated in FIG. 6, the method can comprise:

Step 201: forming a mask layer on a base substrate.

Figure 7:
FIG. 7 is a schematic structural diagram of a base substrate on which a mask pattern is formed according to an embodiment of the present disclosure.

In the embodiment of the present disclosure, as illustrated in FIG. 7, an oxide can be deposited on a base substrate 110, so as to form a mask layer 121.

In some embodiments of the present disclosure, the oxide can comprise at least one of silicon dioxide and silicon nitride. Material for forming the base substrate 110 can comprise any one of sapphire, silicon, or gallium nitride (GaN).

Step 202: Performing a patterning process on the mask layer to obtain a mask pattern.

In the embodiments of the present disclosure, after forming the mask layer 121 on the base substrate 110, the mask layer 121 can be patterned through a single patterning process, so as to forming a mask pattern 120. The single patterning process can comprise steps of depositing a film layer, applying a photoresist, exposing, developing, etching, and peeling off the photoresist, and etc.

Figure 8:
FIG. 8 is a schematic structural diagram of a base substrate on which a photoresist is applied according to an embodiment of the present disclosure.
Figure 9:
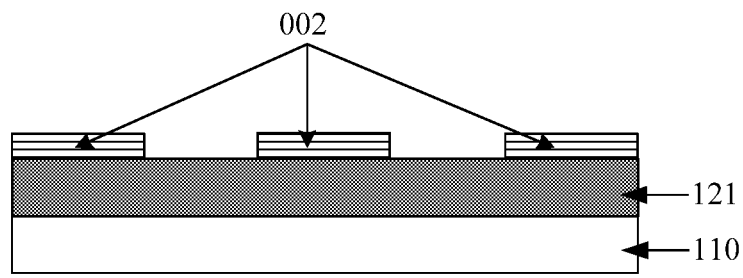
FIG. 9 is a schematic structural diagram of a base substrate on which a photoresist pattern is formed according to an embodiment of the present disclosure.

For example, referring to FIG. 8, after forming the mask layer 121 on the base substrate 110, a photoresist 001 can be applied on the mask layer 121, and then the photoresist 001 is exposed by ultraviolet rays through a mask. And then, the exposed photoresist is developed to obtain a photoresist pattern 002 as illustrated in FIG. 9. Then, the mask layer 121 is etched by using the photoresist pattern 002 as a mask, and the photoresist pattern 002 is peeled off, so as to obtain a mask pattern 120 as illustrated in FIG. 2 or FIG. 3.

As illustrated in FIG. 2 and FIG. 3, the mask pattern 120 can define a plurality of growth regions 130 on the base substrate 110, the plurality of growth regions 130 are separated from each other. The plurality of growth regions 130 may be arrayed in array on the base substrate 110.

For example, the distance between every two adjacent growth regions 130 can be greater than or equal to 1 micrometer (μm), that is, a thickness of the mask pattern between every two adjacent growth regions 130 can be greater than or equal to 1 μm. A direction of the thickness is parallel to the plate surface of the base substrate 110. Keeping a certain distance between adjacent two growth regions 130 can avoid contact between the optoelectronic device epitaxial structures in the two adjacent growth regions 130 and ensure that the adjacent two optoelectronic device epitaxial structures can be effectively isolated.

In the embodiment of the present disclosure, the shape of each of the plurality of growth regions can be circular or polygonal. For example, referring to FIG. 2, the shape of each of the plurality of growth regions can be circular, and the diameter of the circular growth region can be greater than or equal to 1 μm.

It should be noted that, referring to FIG. 2 and FIG. 3, the mask pattern 120 covers only a part of the base substrate 110, and a region not covered by the mask pattern 120 comprises the plurality of growth regions 130.

Step 203, forming an optoelectronic device epitaxial structure in each of the plurality of growth regions on the base substrate.

Since each optoelectronic device epitaxial structure 131 is formed in the growth region 130 defined by the mask pattern 120, the orthographic projection of each optoelectronic device epitaxial structure 131 on the substrate 110 does not overlap the orthographic projection of the mask pattern 120 on the base substrate 110.

Figure 10:
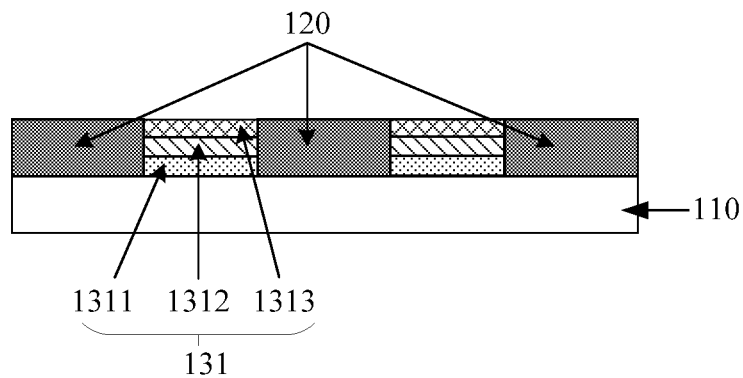
FIG. 10 is a schematic structural diagram of a base substrate on which an optoelectronic device epitaxial structure is formed in each of the plurality of growth region according to an embodiment of the present disclosure.

Referring to FIG. 10, it can also be seen that the thickness of the mask pattern 120 formed on the base substrate 110 is greater than or equal to the thickness of the optoelectronic device epitaxial structure 131, thereby avoiding contact between two adjacent optoelectronic device epitaxial structures 131 and ensuring the effective isolation of two adjacent optoelectronic device epitaxial structures.

In some implementations of the present disclosure, referring to FIG. 10, a process of forming the optoelectronic device epitaxial structure 131 can comprise: sequentially forming a first semiconductor layer 1311, an active layer 1312, and a first semiconductor layer 1313 in each growth region 130 on the substrate 110, so as to form the optoelectronic device epitaxial structure 131.

In some implementations of the present disclosure, the optoelectronic device epitaxial structure 131 may be an LED epitaxial structure, and accordingly, the first semiconductor layer 1311 can be a N-type semiconductor layer, the active layer 1312 can be a light emitting layer, and the second semiconductor layer 1313 can be a P-type semiconductor layer.

In some embodiments of the present disclosure, the optoelectronic device epitaxial structure 131 may be an LED epitaxial structure, and the active layer 1312 may be a multiple quantum well (MQW). If the optoelectronic device epitaxial structure 131 is a photodetector epitaxial structure, the active layer 1312 may be a superlattice layer or a I-type semiconductor layer.

In some embodiments of the present disclosure, material for forming the optoelectronic device epitaxial structure can comprise GaN. That is, the first semiconductor layer 1311, the light emitting layer 1312, and the second semiconductor layer 1313 can all be formed from a GaN-based material.

Since the mask pattern 120 is generally made of at least one of silicon dioxide and silicon nitride, when a GaN-based material is used to form the optoelectronic device epitaxial structure 131, multiple optoelectronic device epitaxial structures can be simultaneously formed in each of the plurality of growth regions 130. Due to the large lattice mismatch between the material for forming the mask pattern 120 and the material for forming the optoelectronic device epitaxial structure 131, the material for forming the optoelectronic device epitaxial structure 131 cannot grow on the surface of the mask pattern, so that the optoelectronic device epitaxial structure 131 is only formed within the growth region. Therefore, after forming the optoelectronic device epitaxial structure 131, the GaN-based material attached to the mask pattern 120 will be automatically peeled off, and is not required to be specially treated.

Step 204, removing the mask pattern.

Figure 11:
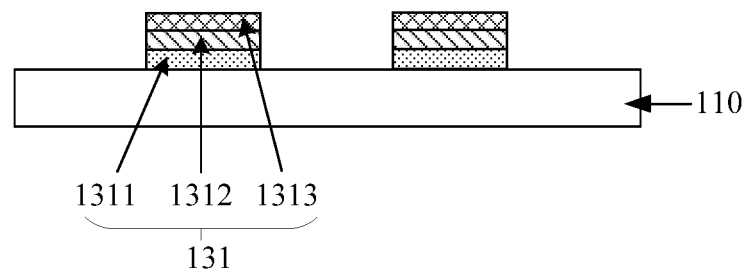
FIG. 11 is a schematic structural diagram of a base substrate from which the mask pattern is removed according to an embodiment of the present disclosure.

In some embodiments of the present disclosure, the mask pattern 120 can be processed through a buffered oxide etch (BOE), so as to remove the mask pattern 120. Referring FIG. 11, a plurality of optoelectronic device epitaxial structures can be formed on the base substrate from which the mask pattern 120 is removed. The wet etching of the mask pattern 120 will not cause damage to the sidewall of the optoelectronic device epitaxial structure 131. Compared with directly etching the semiconductor film layer, this method ensures the performance of the optoelectronic device epitaxial structure.

In some embodiments of the present disclosure, the mask pattern 120 between every two adjacent optoelectronic device epitaxial structures 131 can be completely etched to remove the mask pattern 120. Compared to directly etching a semiconductor film layer, this method can reduce the damage to the sidewall of the optoelectronic device epitaxial structure 131, and ensure the performance of the optoelectronic device epitaxial structure.

In some embodiments of the present disclosure, the mask pattern 120 between every two adjacent optoelectronic device epitaxial structures 131 can be partially etched to remove a part of the mask pattern 120, while remaining a part of the mask pattern at the sidewall of each optoelectronic device epitaxial structure 131. As a part of the mask pattern is remained at the sidewall of each of the optoelectronic device epitaxial structure 131, it is effectively avoided damage to the sidewall of the optoelectronic device epitaxial structure 131 during the etching, thereby guaranteeing the performance of the optoelectronic device epitaxial structure.

It should be noted that, if the optoelectronic device epitaxial structure may be an LED epitaxial structure or a laser epitaxial structure, by removing the mask pattern through the method provided by the embodiment of the present disclosure, the light emitting efficiency of the optoelectronic device epitaxial structure can be guaranteed.

Step 205: bonding the base substrate to an array substrate.

During the bonding, a side of the base substrate on which the optoelectronic device epitaxial structure is formed is bonded to a side of the array substrate on which a thin film transistor (TFT) is formed.

Figure 12:
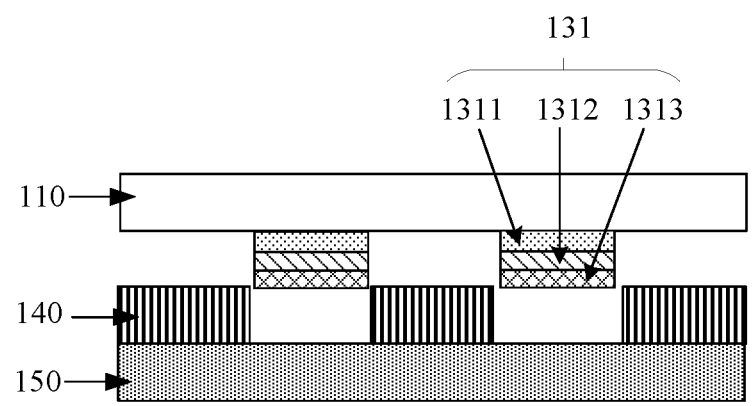
FIG. 12 is a schematic structural diagram of a side of base substrate on which an optoelectronic device epitaxial structure is formed bonded to a side of an array substrate on which a TFT is formed according to an embodiment of the present disclosure.
Figure 13:
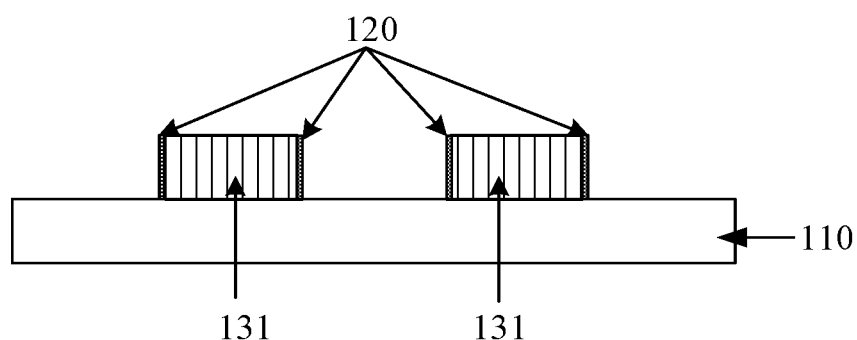
FIG. 13 is a schematic structural diagram of a base of a base substrate formed according to another embodiment of the present disclosure.

In the embodiment of the present disclosure, if the optoelectronic device epitaxial structure is an LED epitaxial structure or a photodetector epitaxial structure, a method such as wafer bonding or mass transfer can be used to transfer the base substrate 110 from which the mask pattern 120 has been removed onto the array substrate 150 on which the thin film transistor 140 is formed. That is, as illustrated in FIG. 12, a side of the base substrate on which the optoelectronic device epitaxial structure is formed is bonded to a side of the array substrate on which the TFT is formed, and the optoelectronic device epitaxial structure 131 is connected to a source or a drain of the TFT 140. During bonding, the orthographic projection of the optoelectronic device epitaxial structure 131 on the array substrate 150 does not overlap with the orthographic projection of the thin film transistor 140 on the array substrate 150.

Step 201: removing the base substrate.

After bonding a side of the base substrate on which the optoelectronic device epitaxial structure is formed to a side of the array substrate on which the TFT is formed, the base substrate 110 can be removed, so as to form an array substrate on which the thin film transistor 140 and the optoelectronic device epitaxial structure are formed.

In some embodiments of the present disclosure, the base substrate may be removed by peeling off. For example, a buffer layer may be formed between the base substrate 110 and the optoelectronic device epitaxial structure 131. When peeling off the base substrate, the buffer layer between the base substrate 110 and the optoelectronic device epitaxial structure 131 can be irradiated by a laser, and is decomposed, thereby peeling off the base substrate 110.

In some embodiments of the present disclosure, the mask pattern 120 can be removed through a buffered oxide etch (BOE). As no mask pattern is remained at the sidewall of each optoelectronic epitaxial structure 131, the base substrate 110 can be peeled off by layer irradiating.

In some embodiments of the present disclosure, an area on the base substrate 110 that is not covered by the optoelectronic device epitaxial structure 131 can be etched to etch away a portion of the base substrate that is not covered by the optoelectronic device epitaxial structure 131. For example, an area on the base substrate 110 that is not covered by the optoelectronic device epitaxial structure 131 can be etched through dry etching.

In some embodiments of the present disclosure, the mask pattern 120 can be removed by etching. As a mask pattern may be remained at the sidewall of each optoelectronic epitaxial structure 131, a part of the base substrate 110 that is not covered by the optoelectronic epitaxial structure 131 can be removed by etching.

In some embodiments of the present disclosure, during the process of manufacturing the optoelectronic device epitaxial structure, the optoelectronic device epitaxial structure can be obtained without etching a semiconductor film layer formed in an entire layer on the base substrate, thereby simplifying the process of manufacturing optoelectronic device epitaxial structure.

It should be noted that the order of steps in the method of manufacturing the optoelectronic device epitaxial structure according to the embodiments of the present disclosure can be adjusted properly, and the steps may be increased or decreased accordingly according to actual requirements. For example, the above step 206 may be performed before step 205, that is, the substrate 110 may be peeled off first to obtain a plurality of optoelectronic device epitaxial structures 131. And then, the plurality of optoelectronic device epitaxial structures can be transferred onto a side of the array substrate on which the thin film transistor 140 is formed. Changes that easily occur to any person skilled in the art within the technical scope disclosed in this disclosure should fall into the protection scope of this disclosure, so it will not be repeated here.

In summary, in the method of manufacturing an optoelectronic device epitaxial structure according to the embodiments of the present disclosure, during manufacturing the optoelectronic device epitaxial structure, a plurality of growth regions that are separated from each other are defined on a base substrate by a mask pattern, so that an optoelectronic device epitaxial structure can be directly obtained through forming the optoelectronic device epitaxial structure in each of the growth regions on the base substrate, without etching the semiconductor film layer formed in an entire layer on the base substrate. And it is avoided to cause damage to a sidewall of the formed optoelectronic device epitaxial structure, the performance of the optoelectronic device epitaxial structure can be guaranteed.

Embodiments of the present disclosure provide an optoelectronic device epitaxial structure, which can be manufactured through the method according to the embodiments of the present disclosure. Exemplarily, the optoelectronic device may be a light emitting diode (LED), a photodetector, a laser, or the like.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A method of manufacturing an optoelectronic device epitaxial structure, comprising:
    forming a mask pattern on a base substrate, the mask pattern defining a plurality of growth regions on the base substrate, and the plurality of growth regions being separated from each other;
    forming an optoelectronic device epitaxial structure in each of the plurality of growth regions, wherein an orthographic projection of each optoelectronic device epitaxial structure on the substrate does not overlap an orthographic projection of the mask pattern on the base substrate, a thickness of the mask pattern is greater than a thickness of the optoelectronic device epitaxial structure, and the thickness of the mask pattern refers to a distance between two adjacent growth regions;
    removing at least part of the mask pattern;
    bonding a side of the base substrate on which the optoelectronic device epitaxial structure is formed to a side of an array substrate on which a thin film transistor is formed; and
    removing the base substrate.

2. The method according to claim 1, wherein removing at least part of the mask pattern further comprises:
    processing the mask pattern through a buffered oxide etch, so as to remove all of the mask pattern.

3. The method according to claim 1, wherein removing at least part of the mask pattern comprises:
    completely etching the mask pattern between every two adjacent optoelectronic device epitaxial structures, so as to remove all of the mask pattern.

4. The method according to claim 1, wherein removing at least part of the mask pattern comprises:
    partially etching the mask pattern between every two adjacent optoelectronic device epitaxial structures, so as to remove part of the mask pattern.

5. The method according to claim 1, wherein forming the mask pattern on the base substrate comprises:
    forming a mask layer on the base substrate; and
    performing a patterning process on the mask layer to obtain the mask pattern.

6. The method according to claim 1, wherein forming the optoelectronic device epitaxial structure in each of the plurality of growth regions on the base substrate comprises:
    sequentially forming a first semiconductor layer, an active layer, and a second semiconductor layer in each of the plurality of growth regions.

7. The method according to claim 6, wherein the first semiconductor layer is an N-type semiconductor layer, the active layer is a light emitting layer, and the second semiconductor layer is a P-type semiconductor layer.

8. The method according to claim 1, wherein a distance between every two adjacent growth regions is greater than or equal to 1 μm.

9. The method according to claim 1, wherein each of the plurality of growth regions is a circular region.

10. The method according to claim 1, wherein a material forming the mask pattern comprises at least one of silicon dioxide and silicon nitride.

11. The method according to claim 1, wherein a material forming the optoelectronic device epitaxial structure comprises gallium nitride.

12. The method according to claim 1, wherein a material for forming the base substrate comprises at least one of sapphire, silicon and gallium nitride.

13. The method according to claim 1, wherein removing the base substrate comprises one of peeling off the base substrate and etching an area on the base substrate that is not covered by the optoelectronic device epitaxial structure.

14. The method according to claim 1, wherein forming the mask pattern on the base substrate comprises forming a mask layer on the base substrate; and patterning the mask layer so as to obtain the mask pattern; and
    removing the mask pattern comprises:
    completely etching the mask pattern between every two adjacent optoelectronic device epitaxial structures, so as to remove all of the mask pattern.

15. The method according to claim 14, wherein forming the optoelectronic device epitaxial structure in each of the plurality of growth regions on the base substrate comprises:
    sequentially forming a first semiconductor layer, an active layer, and a second semiconductor layer in each of the plurality of growth regions.

16. The method according to claim 1, wherein forming the mask pattern on the base substrate comprises forming a mask layer on the base substrate; and patterning the mask layer so as to obtain the mask pattern; and
    partially etching the mask pattern between every two adjacent optoelectronic device epitaxial structures, so as to remove part of the mask pattern.

17. The method according to claim 16, wherein forming the optoelectronic device epitaxial structure in each of the plurality of growth regions on the base substrate comprises:
    sequentially forming a first semiconductor layer, an active layer, and a second semiconductor layer in each of the plurality of growth regions.

18. The method according to claim 17, wherein removing the base substrate comprises one of peeling off the base substrate and etching an area on the base substrate that is not covered by the optoelectronic device epitaxial structure.

19. The method according to claim 1, wherein forming the mask pattern on the base substrate comprises:
    forming a mask layer on the base substrate; and patterning the mask layer so as to obtain the mask patter, and wherein removing at least part of the mask pattern comprises:

processing the mask pattern through a buffered oxide etch, so as to remove all of the mask pattern.

20. The method according to claim 19, wherein forming the optoelectronic device epitaxial structure in each of the plurality of growth regions on the base substrate comprises:

sequentially forming a first semiconductor layer, an active layer, and a second semiconductor layer in each of the plurality of growth regions.

\* \* \* \* \*